United States Patent [19]

Breunsbach et al.

[11] Patent Number: 5,246,023
[45] Date of Patent: Sep. 21, 1993

[54] METHOD AND APPARATUS TO CLEAN AND CLEANLINESS TEST PRINTED CIRCUIT BOARDS

[75] Inventors: Rex Breunsbach, Clackamas; Paul M. Austen, Milwaukie, both of Oreg.

[73] Assignee: Electronic Controls Design, Inc., Milwaukie, Oreg.

[21] Appl. No.: 715,441

[22] Filed: Jun. 14, 1991

Related U.S. Application Data

[63] Continuation-in-part of Ser. No. 513,665, Apr. 24, 1990, Pat. No. 5,027,841.

[51] Int. Cl.$^5$ .................................... B08B 3/02
[52] U.S. Cl. ............................ 134/57 R; 134/109; 134/111; 134/902
[58] Field of Search ................ 134/902, 57 R, 109, 134/110, 111

[56] References Cited

U.S. PATENT DOCUMENTS

| | | | |
|---|---|---|---|
| 3,871,914 | 3/1975 | Goffredo et al. | 134/109 |
| 3,880,685 | 4/1975 | Rehm et al. | 134/57 R |
| 3,964,956 | 6/1976 | Snyder | 134/57 R |
| 3,973,572 | 8/1986 | Brous | 134/109 |
| 4,682,615 | 7/1987 | Burkman | 134/95 |
| 4,731,154 | 3/1988 | Hausman Hazlitt et al. | 134/902 X |
| 4,977,688 | 12/1990 | Roberson, Jr. et al. | 134/902 X |
| 5,022,419 | 6/1991 | Thompson et al. | 134/902 |

Primary Examiner—Frankie L. Stinson
Attorney, Agent, or Firm—Klarquist, Sparkman, Campbell, Leigh & Whinston

[57] ABSTRACT

The present invention is an apparatus to clean and cleanliness test printed circuit wiring boards and includes an inner chamber and an outer enclosure encasing the inner chamber. A rack within the chamber is adapted to hold a plurality of PCBs having electronic components assembled thereon. An operator programmable microprocessor controller causes a saponifier solution to be introduced into the interior chamber. The saponifier solution is pumped through a diffusion assembly in the chamber to spray the solution onto the PCBs. Upon completion of this cleaning cycle, the saponifier solution is drained by gravity out of the chamber. This is followed by a water rinsing cycle utilizing the same hardware and procedure. Once the rosin saponification cleaning cycle and water rinsing cycle are complete, the system controller empties the wash chamber and pumps in a standard resistivity test mixture of 75% isopropyl alcohol (IPA) and 25% water. A MIL-P-28809 cleanliness test is then performed on the PCBs. The PCBs are rinsed in the test IPA mixture by the diffusion assembly at a set temperature for a set time. If the test IPA mixture has a resistivity of $\leq 2$ M$\Omega$/cm$^3$, the PCBs are determined to be contaminated and are rejected for re-cleaning.

15 Claims, 3 Drawing Sheets

METHOD AND APPARATUS TO CLEAN AND CLEANLINESS TEST PRINTED CIRCUIT BOARDS

RELATED APPLICATIONS

This application is a continuation-in-part of our co-pending application Ser. No. 07/513,665, filed Apr. 24, 1990 and issued as U.S. Pat. No. 5,027,841 on Jul. 2, 1991.

FIELD OF THE INVENTION

This invention relates to a method and apparatus to clean and cleanliness test printed circuit boards (PCBs) and other electronic assemblies. More particularly, the invention relates to a PCB batch cleaning system utilizing non-combustible saponifiers in an enclosure to remove contamination from such boards. The invention incorporates an isopropyl alcohol post-wash PCB batch rinsing and cleanliness test performed within that same enclosure utilizing the same system hardware.

BACKGROUND AND SUMMARY OF THE INVENTION

During the assembly of components on printed circuit wiring boards (PCBs), soldering fluxes are applied to the substrate board material to insure that solder firmly bonds the components to wiring traces imprinted on the PCB. Typically, these fluxes are either rosin-based or non-rosin-based. Non-rosin-based fluxes are water soluble but are not easily removed with water alone. Usually, these fluxes are removed with saponifiers. Aqueous removal of flux from PCBs through saponification has been used for a number of years and is well known in the art. Automated batch cleaning systems which use this method have been perfected to the point where they not only clean, but also measure and record PCB batch parameters such as wash time and temperature, chemistry mix, etc. One such system is the Model 6300 $\mu$P manufactured by Electronic Controls Design (ECD) of Portland, Oreg. A related system but utilizing solvents rather than saponifiers is the Model 6307 of ECD, which is the subject of our copending U.S. application Ser. No. 07/513,665, filed Apr. 24, 1990, assigned to the present assignee and incorporated herein by reference. The Model 6307 uses semi-aqueous solvents and an inert gas air purge and pumping system during the solvent spray-washing cycle.

As indicated, PCBs are customarily cleaned after soldering operations to remove various contaminants caused by the soldering process. Such ionic contamination (both positive and negative ions) can cause corrosion if not removed from the PCB. Most cleaning processes used by manufacturers of PCBs result in substantially clean boards. However, in high precision electronic applications a high level of cleanliness, and a method to verify that level of cleanliness, is imperative. The standard method for testing PCB cleanliness is MIL-P-28809 (MIL-SPEC test). This test method involves measuring the resistivity of a known alcohol (typically isopropyl alcohol or "IPA") and water mixture, at a known temperature for a given PCB area, before and after the IPA mixture is exposed to a "cleaned" PCB. If the final rinse resistivity of the IPA mixture drops below 2 M$\Omega$/cm$^3$ the PCB is considered contaminated and must be rejected. Information concerning this method can be found in any number of references, including: *Batch Aqueous Cleaning—The Road to Ultra Clean PCB Assemblies,* Electronic Controls Design, Inc., 1987. An accepted and typical method and apparatus for carrying out a mil-spec test on electronic assemblies is disclosed in U.S. Pat. No. 4,023,931 to Wolfgram. It involves immersing the electronic assembly in a static pool of a mixture of deionized water and isopropyl alcohol.

Previously, a direct correlation between final rinse resistivity of water and MIL-P-28809 method cleanliness test results has been difficult to achieve due to differences in ion behavior in water as distinguished from water-alcohol mixtures. To overcome this shortcoming, the system of the present invention incorporates in a batch-type cleaning system and method a water-alcohol cleanliness test cycle following a cleaning cycle and preferably also following a water rinse cycle. The invention is directed especially to a method and apparatus for testing the reliability of an aqueous cleaning process by determining the ionic contamination of PCBs following the cleaning process. The testing method is designed to utilize the same hardware and system as that used in the preceding aqueous cleaning process cycle.

The apparatus of the present invention includes an inner chamber of corrosion resistant material and an outer enclosure encasing the inner chamber. A rack within the chamber is adapted to hold a plurality of PCBs having electronic components (e.g., resistors, capacitors, inductors, ICs and the like) assembled thereon. An operator programmable microprocessor controller causes a saponifier solution to be introduced into the interior chamber. The saponifier solution is pumped through a diffusion assembly in the chamber to spray the solution onto the PCBs. Upon completion of this cleaning cycle, the saponifier solution is drained by gravity out of the chamber. This is followed by a water rinsing cycle utilizing the same hardware and spraying procedure.

Once the rosin saponification cleaning cycle and water rinsing cycle are complete, the system microprocessor controller empties the wash chamber, purges the chamber of air using an inert gas such as nitrogen, and pumps in a standard resistivity test mixture of 75% isopropyl alcohol (IPA) and 25% water. (Experimentation has shown this IPA percentage by volume to be ideal in performing the MIL-P-28809 cleanliness test outlined above and is well known in the art). The PCBs are rinsed in the test IPA mixture by the diffusion assembly at a set temperature for a minimum set time. The test IPA mixture is continuously filtered, resistivity tested and recirculated for an additional set time or until the preset resistivity level is reached, whichever occurs first. If, after the rinse-test cycle is complete, the test IPA mixture has a resistivity of $\geq 2$ M$\Omega$/cm$^3$, the PCBs within the chamber are determined to be clean. If the test IPA mixture has a resistivity of $\leq 2$ M$\Omega$/cm$^3$, the PCBs are determined to be contaminated and are rejected for re-cleaning. If the PCBs pass the test, they are then air dried and the system is reset for the next batch.

It is an object of the present invention to provide a batch cleaning system and method for PCBs which can provide as part of the system and method total PCB batch mil-spec testing of the contamination level of an alcohol/water mixture used for rinsing PCBs.

A related object is to provide a method and system as aforesaid which uses the batch cleaning system's cleaning hardware and processes to carry out the mil-spec testing as a final cycle in a multi-cycle cleaning process that may also include a prewash cycle, a wash cycle, and a water rinse cycle.

Another object is to provide a method and system as foresaid which enhances the cleanliness of the PCBs as a byproduct of the mil-spec testing.

Other objects of the invention are to provide a batch cleaner for PCBs which can monitor and record the various parameters of the cleaning, rinsing and resistivity testing cycles, and wherein the parameters of the various cycles are programmable by the operator. Other objects, features and advantages of the present invention will be apparent from the following description of a preferred embodiment thereof and from the accompanying drawings. While the present invention is described in conjunction with an aqueous cleaning system, it can also be adapted for use with a semi-aqueous or solvent cleaning system such as described in our aforementioned copending application.

DETAILED DESCRIPTION OF THE INVENTION

The present invention performs a high level of aqueous washing and rinsing of printed circuit boards (PCB's) and includes programming capability of all functions and parameters. The system of the present invention, in addition to the aqueous washing and rinsing functions, contains a complete isopropyl alcohol (IPA) and water rinsing system coupled with a resistivity testing procedure to emulate the MIL-P-28809 standardized method of single-board testing as discussed herein. The present invention is therefore a combined cleaning and testing system which incorporates both an aqueous cleaning and an IPA cleanliness test process and rinsing process, utilizing the same basic spray-cleaning hardware for both processes and all machine operating cycles, including where used, (1) prewash cycle, (2) wash cycle, (3) water rinse cycle and (4) IPA rinse/test cycle.

Figure 2:
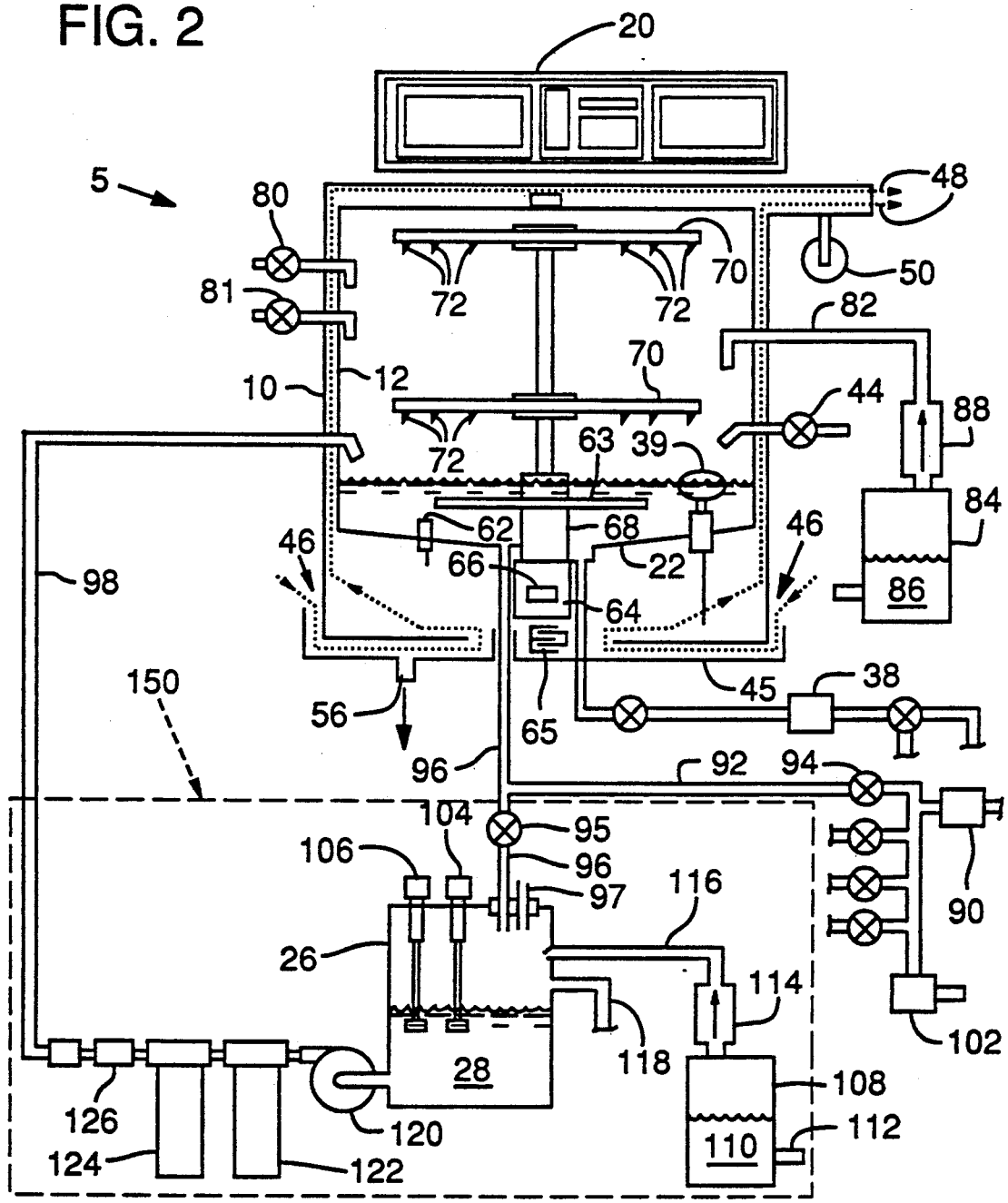
FIG. 2 is a schematic diagram of the apparatus of FIG. 1 showing the operative relationship of its various components.
Figure 3:
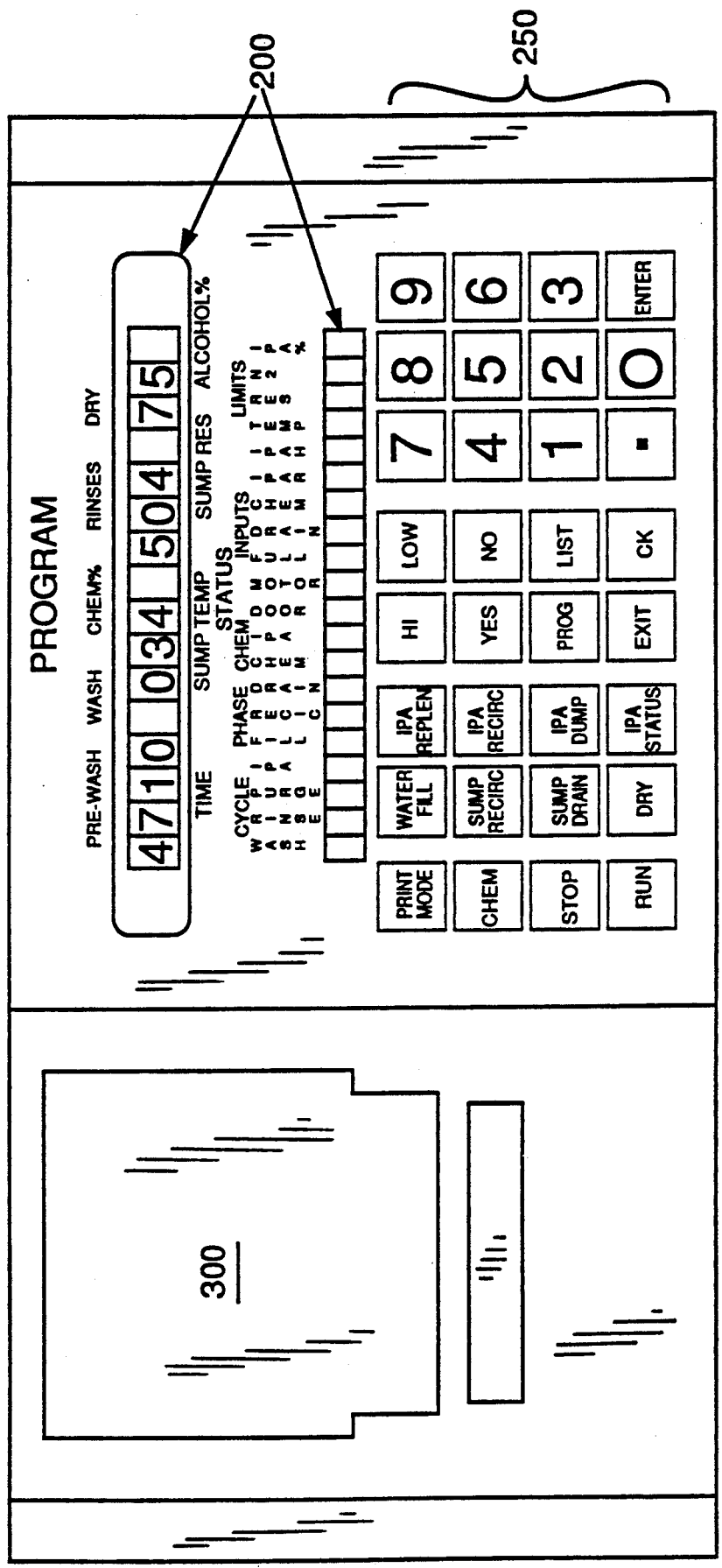
FIG. 3 is a front view of the controller of the apparatus of FIG. 1 showing the program and cycle display, status display, keyboard, and output tape from the printer.

Referring to FIG. 2, the system and method of the invention is governed by a microprocessor controller 20. Controller 20 controls the aqueous wash and rinse-testing cycles for the PCB batch cleaning system. Either the cleaning cycle or the testing cycle may be enabled or disabled by supervisory programming of the controller. The controller receives signals and issues commands to and from various components and sensor apparatus. An operator communicates with the controller through a series of programming keys 250. These are shown in FIG. 3. The controller communicates with the operator through a series of status lights and indicator displays 200, and a hard copy printout 300. These are also shown in FIG. 3. If the controller detects a problem, it prints a descriptive error message and may abort the entire cycle.

The system of the invention includes measurement instruments to monitor chemistry mix, fluid level, drain flow, resistivity and temperature. The present system particularly incorporates a water level sensor 39 for rapid and accurate filling, and a drain-flow sensor 38 that reduces cycle times to allow for greater PCB batch throughput. During operation, the controller 20 continually monitors the system chemistry (saponification solution, water and IPA-water mixture) via these instruments. These provide the basis for the units' automated process control.

In the present invention, the controller provides automatic filling, washing, and draining and provides control and programmability of all essential system functions and parameters. The controller programmable functions include: pre-wash time; wash cycle time; chemistry concentration; minimum number of rinses; wash temperature; alcohol percentage; waste classification; use of batch numbers; lot number; machine number; date and time; dry time; alcohol rinse time; and nitrogen purge time. Associated with the controller 20 is a display unit and printer to provide PCB batch process documentation. The displays include: alcohol percentage (temperature compensated); cycle time remaining; sump temperature; sump resistivity; and cycle status. The printouts include: time and date; temperatures of the motor, the sump, and the sample chamber; alcohol percentage; cycle times; alarm points; machine number; batch number; and lot number. The controller also contains a real-time clock so that all documentation is automatically timed and dated.

PCB Aqueous Wash Cleaning System and Method

The aqueous wash cycle of the present invention is composed of three phases: prewashing, washing and rinsing. A fourth drying phase is optionally available at the end of the aqueous wash cycle should the operator decide not to follow the aqueous cleaning cycle with the IPA cleanliness testing cycle. Although very similar, each phase of the wash cycle is optimized for different factors and is contemplated to be fully programmable. As an aqueous wash cycle progresses, the current phase status is shown on the controller's LED bar graph 200, and process information is printed on the paper tape 300. These are shown in FIG. 3.

Figure 1:
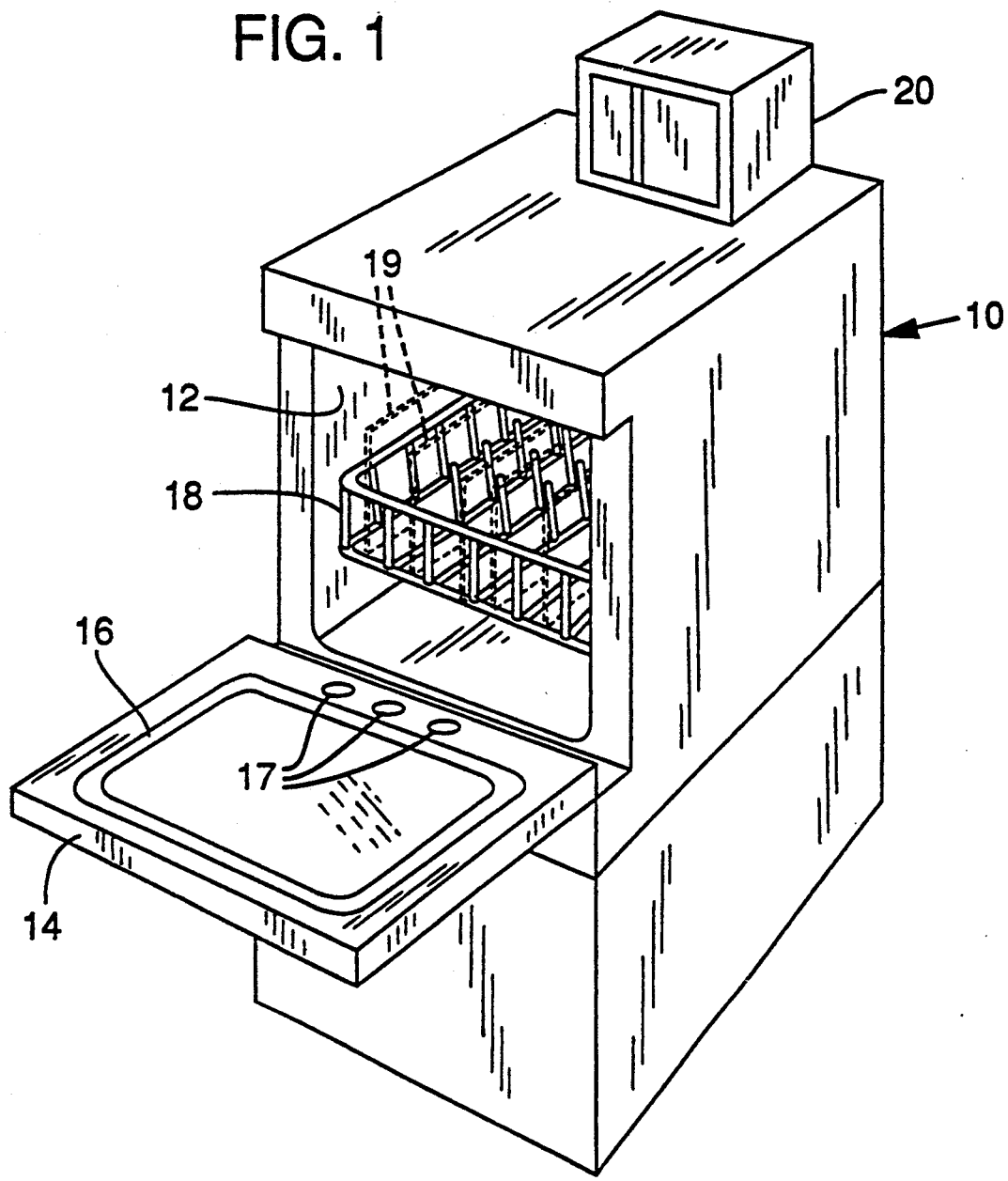
FIG. 1 is a perspective view of an apparatus to clean and cleanliness test printed circuit boards of the present invention.

Referring to FIGS. 1 and 2, the PCB batch aqueous cleaning and IPA rinse testing apparatus of the present invention 5 has an outer enclosure 10 surrounding and spaced from an inner chamber 12. The chamber 12 is made of a corrosion resistant material such as stainless steel or the like. A door 14 is hinged to the outer enclosure. A seal 16 is located on the front of the apparatus to seal the door to the inner chamber. When the door is closed, the inner chamber becomes substantially "liquid-tight". An air vent 17 is provided in the door to prevent any pressure build-up within the chamber. The inner chamber 12 has a lower area or sump 22 which functions as the primary work area.

A rack assembly 18 adapted to hold PCBs 19 or other electronic components is slidable into and out of the inner chamber when the door is open. The system of the present invention is capable of cleaning PCBs on edge so that cohesional and adhesional forces remove contaminants from small spaces and prevents puddling of cleaning agent.

After the rack 18 is loaded with PCBs, slid into the chamber and the door closed, controller 20 causes the chamber to fill partially with water. This is accomplished via a conduit and valve arrangement 81. When the sump 22 is full (approximately 2.5 gallons), sump full sensor 39 triggers controller 20 which in turn closes valve 81.

A drip pan 45 fits below the outer enclosure 10 and the inner enclosure 12 to collect any liquid contents which may leak from the inner enclosure. A space exists between the outer enclosure 10 and the inner enclosure 12 to form a path for air flow 46 between the inner and outer enclosure. A plenum outlet 48 is provided to exhaust air which passes between the inner enclosure 12 and the outer enclosure 10 or from the door vent 17 to the atmosphere. A fan proving switch 50 is located in the outlet air flow to detect whether air is being pulled from the plenum. Switch 50 sends a signal to controller 20. Should no air flow be detected by switch 50, the cycle may be aborted, the sump 22 drained of its contents and an indicator light lit. A drain 56 is provided in drip pan 45 to drain away any collected saponifier solution or alcohol-water mixture 28.

As stated, a typical complete aqueous wash cycle comprises one prewash, one wash with a saponifier and four rinses with deionized water. Referring to FIGS. 1 and 2, during each phase (except the drying phase) the machine 5 fills the wash chamber 12 with deionized water, recirculates it over the PCBs 19 nested therein for a programmed time period, then drains the water away and proceeds to the next phase. The wash chamber will typically hold approximately 2.5 gallons so each discrete phase of the complete aqueous wash cycle will consume approximately that volume of water. A typical aqueous wash cycle (e.g., one prewash, one wash and four rinses) will use and drain approximately 15 gallons of water. All waste water is drained to a sewer.

The prewash phase preheats the PCBs 19 within the sump 22 and chamber 12 to a water temperature selected by an operator. Preheating is accomplished by recirculating heated water over the PCBs utilizing sump heater 63, pump 65 and diffusion assembly 70. These are shown in FIG. 2. This action promotes saponification during the subsequent wash phase. Since some fluxes do not benefit by preheating, the operator may disable this phase by programming it to a zero time duration.

With respect to the aqueous wash phase of the invention, a feed pipe 82 communicates with the chamber and with a chemistry supply container 84. The container 84 contains a saponifier agent 86. (A typical agent would be WL 1000 manufactured by Indusco ® which is especially suited for removing non-rosin-based fluxes from PCBs). The saponifier 86 is pumped out of the container 84, through the conduit 82 and into the chamber 12 by a metering chemical pump 88 under the operation of controller 20.

The actual cleaning of the PCBs is accomplished in this wash phase. Here, saponifier is added to the hot water recirculating over the PCBs in the immediately preceding prewash phase. A diffusion spray assembly is provided to introduce the sump contents on to the PCBs. The diffusion assembly includes a motor 64 driving a first pump 68 provided for pumping the saponifier solution 86 or alcohol-water mixture 28 during the cleaning or rinse-testing cycles, respectively. The IPA mixture or saponifier solution exits nozzles 72 located on the spray arms 70 to spray the liquid down upon rack 18 and thus onto the electronic assemblies nested thereon. The motor 64 rotates the spray arms 70. As contemplated, the present invention uses dual, counter-rotating wash arms 70 driven by a high-capacity pump 68 to flood each PCB nested within the cleaning chamber at a flow rate of 60 gallons per minute (only 2½ gallons are actually used per cycle). The arms 70 rotate at a minimum speed of 24 rpm—a rate calculated as optimal for fast, thorough cleaning. The axial pump 68 is driven by a ⅓ hp heavy-duty motor 64 to deliver the maximum amount of water with a minimum of expended energy.

Controller 20 which controls the operation of the motor 64 continues the cleaning cycle for the preprogrammed amount of time. The recirculation time and the amount of saponifier are both operator programmable. The water temperature is not controlled by the system, but is monitored. The system will print an error message on the printout 300 and may abort from some phases of the cycle if the sump temperature is outside a programmed window (i.e., too high or low). A motor temperature sensor 66 constantly monitors the temperature of the motor and sends a signal to the controller 20. Should the motor 64 over-heat, the controller 20 can terminate the cleaning cycle and drain any saponifier solution or IPA mixture 28 from the sump 22. Like the prewash phase, the wash phase may be omitted by programming its recirculation time to zero duration. After the preprogrammed wash time has elapsed, the controller 20 will cause the saponifier solution in sump 22 to drain. This is immediately followed by a water rinse phase.

The water rinse phase of the wash cycle (as distinguished from the alcohol-water mix rinse-testing cycle outlined immediately below) is optimized to achieve a final sump contents resistivity of $\geq 500$ K$\Omega$. This is determined by a conductivity probe 62 positioned within sump 22 and operatively connected to controller 20. The cleaning system according to the present invention will continue rinsing until this threshold is traversed or until the unit has performed any operator programmed maximum number of rinse phases. If the PCBs placed into the cleaning system are initially "clean", the system can be programmed to complete a specified number of rinses even though the target resistivity has not been met. The rinse recirculation time is approximately one minute and is not contemplated as operator programmable. If the aqueous wash phase is enabled but the prewash and wash times are programmed to zero time duration, as indicated above, the rinse phase becomes a preparation for the IPA cleanliness test cycle, preheating the boards and ensuring a nominal "cleanliness" of 500 K$\Omega$. Following the rinse phase of the aqueous wash cycle, the controller 20 will cause any liquid contents in sump 22 to drain.

Should the cleanliness testing cycle be disabled, drying is the final phase. This phase runs the dryer fan 44 for a programmed time to cool the PCBs and provide an opportunity for drip-off before the boards are removed from the wash chamber.

PCB Alcohol Cleaning and Cleanliness Testing Process

The isopropyl alcohol (IPA) rinse-testing process has several purposes. The first is to perform an isopropyl alcohol rinse of the boards. This is an accepted method in the art for rinsing boards. Secondly, the alcohol cleaning process performs a cleanliness test to emulate the MIL-P-28809 (mil-spec) method of single-board testing as described herein. Finally, the alcohol cleaning process serves to further clean the boards. As indicated above, the IPA cleaning process can be disabled by supervisory programming.

To accomplish the above objectives, three conditions must be met. First, the rinsing action must take place for a predetermined minimum time, typically 15 minutes. Second, the temperature of the IPA mixture must reach 115° F. ±15° F. Finally, the resistivity of the IPA mixture in the wash chamber must be $\geq 2.00$ M$\Omega$/cm$^3$. A PCB cleaning system according to the present invention is contemplated to rinse to a maximum of 30 minutes or until all three of the above-mentioned conditions are met, whichever first occurs. If all conditions are met, the boards "pass" the cleanliness test. If not, they "fail" and must be recleaned. (The reliability of the test results depend on the total board surface area present in the wash chamber. As per the MIL-P-28809 test previously discussed, 10 mL of an IPA/water test mixture is required for each square inch of board surface area. The preferred system of the present invention holds 10 L (10,000 mL) of IPA mixture. Therefore approximately 10,000 square inches of board surface is typically required per cycle).

The PCB alcohol cleaning and cleanliness testing process is governed by controller 20. An important and unique feature of the invention is that much of the apparatus componentry used in performing the MIL-P-28809 cleanliness testing process is the same as that employed in aqueous wash cycle, including the chamber 12 with sump 22, the rack 19, the motor 64 and wash pump 68, and the diffusion assembly 70. Positioned within sump 22 is a conductivity probe 62 for communicating to the controller the relative resistance of any IPA mixture 28 located within the sump. To perform the IPA cleaning and testing process, an Alcohol Control Unit (ACU) 150 is combined with these elements. The ACU is shown in FIG. 2 and includes: an IPA holding tank 108 to contain a supply of absolute isopropyl alcohol; an IPA mixture holding tank 26 to contain a 75%-25% IPA and water mixture 28; an IPA low sensor 112 attached to the IPA holding tank to detect the level of absolute IPA in the tank 108; a sample cell 128 to sample the contents of tank 26; a sample fill pump 130 to deliver a sample of IPA mixture 28 in tank 26 to sample cell 128; a level and temperature probe 106 to determine the volume and temperature of the IPA mixture 28 in tank 26; a specific gravity probe 104 to determine the purity of the IPA mixture 28 in tank 26; a recirculation pump 120 to pump IPA mixture 28 out of tank 26; a filter 122 to filter the IPA mixture 28 as it passes therethrough; a DI water column 124 to add water to IPA mixture 28 as necessary as it passes therethrough; an IPA heater 126 to elevate the temperature of the IPA mixture 28 as it passes therethrough; and conduit 98 to deliver the IPA mixture 28 to the chamber 12. After the IPA mixture 28 is recirculated over the PCBs in wash chamber 12 by the motorized pump 68 and diffusion assembly 70 (outlined below), the IPA mixture 28 is drained from sump 22 through conduit 96 and an open IPA control valve 95 and thereafter back into tank 26.

Because the test IPA mixture 28 contains alcohol, safety criterion have been incorporated into the present invention. First, the ACU 150 in which the IPA mixture 28 is stored and processed is constructed as an external, double-walled enclosure. Throughout the alcohol cleaning and cleanliness testing process, the door 14 to the ACU is locked via an air cylinder controlled by position of IPA loop valve 95. This is shown in FIG. 2. When this valve is open and the IPA mixture 28 is being recirculated through the washer 5, the cylinder is in the locked position. When the IPA loop valve is closed, the cylinder is in the unlocked position. A pneumatic indicator is provided on the external front of the ACU to show the status of this cylinder.

A second safety measure of the present invention provides automatic termination of any cycle in the event of an abortive interruption. These abortive interruptions include: power loss, pressing an emergency-stop button, forcing the door lock open, loss of nitrogen pressure, loss of plenum flow, loss of purge gas flow, or any over-temperature detection. In any of these events, any IPA mixture 28 in the chamber 12 will flow back into the container 26 within the ACU.

Another important safety feature is a nitrogen (N$_2$) gas purge of the wash chamber 12. The first phase of the alcohol cleaning-testing process is the N$_2$ purge which occurs before the IPA mixture 28 is introduced into the chamber. This purge reduces the oxygen content and thus the flammability of the contents of the chamber. A pressurized gas container, not shown, introduces N$_2$ through a pressure regulator 90 and control valve 94 into a gas feed pipe 92. Valves 94 and 95, when opened by controller 20, allow the regulated gas to flow through pressure feed pipe 92 and thereafter through pipe 96 into the interior of sump 22 and IPA mixture holding tank 26. Valve 94 in pressure feed line 92 under operation of controller 20, when opened, allows the inner enclosure 12 to be purged of air by forcing N$_2$ therein. Similarly, when valve 95 is open, nitrogen purges holding tank 26 of air through vent 97. The N$_2$, being lighter than air, lies atop the air within the inner enclosure 12 and forces the air out the vents 17 in door 14. Vents 17 may communicate directly to the atmosphere through the top of door 14 or may be collected by a plenum 48. A pressure indicator 102 assists in controlling this function. As contemplated, the major purge continues typically for 1.5 minutes and uses 10 to 12 cubic feet of N$_2$. A minor bleed of N$_2$ gas into the chamber continues throughout the IPA recirculation cycle. The pressure of the N$_2$ supply is constantly monitored to provide additional protection. It will be recognized that any inert gas will substitute in the present invention.

Additional safety devices are also provided. A sump temperature sensor 62 continuously monitors the temperature in the sump 22 of the inner enclosure 12. This signal is fed to the controller 20. Should the temperature sensor 62 detect an over-temperature condition, the cleaning cycle can be immediately terminated, and any saponifier solution or IPA mixture 28 drained out of the sump. A door interlock switch 67 detects when the door 14 is open. The switch sends a signal to the controller 20 which prevents the door from being opened if liquid is present in the sump 22. Attempts to open door 14 during any cycle will abort the cycle and any liquid will be drained out of the sump.

Referring again to FIG. 2, when the major purge is completed, the microprocessor controller 20 energizes pump 120 to begin pumping a continuously heated IPA and water mixture 28 from the IPA holding tank 26 into the wash chamber 12. This is accomplished via recirculation pump 120, filter 122, DI water column 124, IPA heater 126, and IPA feed conduit 98, all located within the segregated ACU enclosure 150. The level indicator 39 sends a signal to the controller 20 which closes the valve 95 to hold the level of the IPA mixture 28 at the proper level within the sump 22. The IPA mixture 28 continues to flow into the sump 22 until the level indicator 39 indicates that the sump is at its proper level. Accurate temperature monitoring has been designed in to make sure that the temperature of the contents of the wash chamber and sump is maintained well below critical. (The temperature of the main drive motor 64 is also monitored continuously, and the motor 64 automatically shuts down if the maximum temperature is exceeded). If the concentration of the IPA mixture 28 requires correction, absolute alcohol 110 is metered into the flow at this time from an IPA replenishing tank 108. This is accomplished via IPA low sensor 112, IPA replenish pump 114 and IPA feed conduit 116.

The recirculation pump 120 is activated shortly after the IPA mixture 28 enters the chamber, but before the sump 22 is full. This prevents the sudden blast of IPA mixture 28 into and around the chamber that would happen if the sump were full when the pump is started. When the heated IPA mixture 28 enters the wash chamber it expands the atmosphere in the chamber creating a positive pressure therein.

During recirculation, the IPA mixture 28 is continuously circulated in the chamber by the diffusion assembly and is simultaneously circulated through the ACU. In the ACU, the mixture is filtered through a filtering means including a carbon filter and de-ionizing column to remove organic and ionic contaminants. The filters include a 25 micron particle filter 122 and a mixed-bed deionized water column 124. The IPA mixture 28 is heated via IPA heater 126. The IPA heater 126 set point is $115°$ F.$\pm15°$ F. and requires between ten and fifteen minutes to elevate the IPA mixture 28 from room temperature to this set point. (At the set point temperature, and for a 75% isopropyl alcohol/25% water mixture, resistivities $>200$ M$\Omega$/cm$^3$ can be obtained. However, when the IPA mixture is exposed to air it will absorb carbon dioxide ($CO_2$) which will reduce the resistivity to $<100$ M$\Omega$. Typically, 1-10 M$\Omega$ resistivities at the beginning of the alcohol cleaning process, and resistivities greater than 20 M$\Omega$ at the end of the process will occur).

The microprocessor controller 20 recirculates the IPA mixture 28 within the wash chamber for a programmed minimum IPA cleaning time, for example, 15 minutes. Following this the controller begins monitoring the sump temperature and resistivity via conductivity probe 62 as recirculation and rinsing continue. In order to pass the cleanliness test, the IPA mixture must reach approximately $115°$ F.$\pm15°$ F. and at least 2 M$\Omega$ resistivity per cubic centimeter. If these conditions (time, temperature and resistivity) are achieved, the test is complete the IPA rinse-test cycle is discontinued, and the boards have "passed". The PCB cleaning system according to the present invention will then continue into a drying cycle. The microprocessor controller will only recirculate the IPA mixture over the PCBs for a maximum of 30 minutes, at which time if the MIL-P-28809 parameters are not achieved the boards are deemed to have "failed" the test.

The specific gravity of the test IPA mixture 28 is continuously monitored in the sample cell 128 to determine the need for automatic alcohol or water addition. This function is performed continuously and simultaneously with the recirculation of the IPA mixture through the diffusion assembly and through the ACU as just discussed. A pump 130, under control of the controller 20, is provided to fill the sample cell 128. The cell includes a temperature and level detector 106 and a specific gravity detector 104. The detectors send their signals to controller 20. Based upon the combination of these signals, the controller 20 can calculate the specific gravity of the alcohol-water mixture 28 used for cleaning and testing the PCBs. The specific gravity of the IPA mixture increases as alcohol evaporates and as flux and other contaminants become dissolved in the IPA mixture 28. The specific gravity of the IPA mixture is therefore an indication of the purity of the IPA mixture. Once the specific gravity of the cleaning saponifier becomes greater than a predetermined level, a signal is generated that causes controller 20 to activate an IPA replenish pump 114 to deliver absolute IPA from the holding tank 108 to the holding tank 26. The IPA mixture sampling operation continues throughout the cleanliness testing cycle.

The final dry cycle is preceded by a short drain period to allow the IPA mixture 28 to return to the holding tank 26. In draining the sump 22 of the alcohol and water mixture 28, a pressure relief valve 95 under control of controller 20 is opened, thus allowing the alcohol and water mixture 28 in the sump 22 to flow back into the holding tank 26 via gravity. During this drain period, a small amount of water will be added to the wash chamber and allowed to drain to the sewer. This dilutes any IPA mixture 28 present in the drain plumbing. In the dry cycle the dry time is programmable from the front panel. The dry cycle is complete at the end of the programmed dry time. After the dry cycle, the IPA valve is closed, the door is unlocked and the test results are printed. Test results are printed only after the dry cycle to discourage a operator from unloading the machine prematurely when alcohol vapors might remain in the sump.

It should be understood that the batch cleaning and mil-spec testing system described can be programmed to eliminate any one or more of the prewash, wash, and water rinse cycles before commencing the IPA rinse-test cycle. Similarly, the dry cycle may be optional. It should also be understood that the mil-spec test cycle described could also be incorporated in a semi-aqueous solvent-based batch cleaning apparatus such as that described in our aforementioned copending application. In such case, the nitrogen purge of air would commence at the beginning of the wash cycle rather than at the beginning of the IPA rinse-test cycle.

Having described and illustrated the principles of my invention with reference to a preferred embodiment, it will be apparent that the invention can be modified in arrangement and detail without departing from such principles. Accordingly, I claim as my invention all such modifications as may fall within the scope and spirit of the following claims and equivalents thereof.

I claim:

1. An apparatus for cleaning flux and other contaminants from printed circuit boards and other electronic assemblies comprising:

a cleaning chamber;

means for holding electronic assemblies in the cleaning chamber;

means providing at least one wash cycle including a cleaning liquid spray means wherein a cleaning liquid is sprayed onto the electronic assemblies within the chamber and drain means operable to drain the cleaning liquid from the chamber when the wash cycle is completed;

means providing at least one alcohol-water rinse cycle operable after completion of the wash cycle including alcohol-water spray means for spraying an alcohol and water mixture onto the electronic assemblies within the chamber to rinse the electronic assemblies, said alcohol-water spray means including said cleaning liquid spray means;

and testing means for testing the resistivity level of said mixture as an indication of the cleanliness of the assemblies, including means for recirculating and filtering the mixture as it is sprayed over the assemblies and means for controlling the temperature of the mixture while it is sprayed, wherein said testing means tests the level of ionic contamination in the alcohol-water mixture and includes (a) temperature monitoring means for monitoring the temperature of the mixture in the chamber, (b) resistivity measuring means for monitoring the resistivity of the mixture in the chamber, (c) volume measuring means for monitoring the quantity of mixture in the chamber, (d) specific gravity measuring means for monitoring the specific gravity of the mixture, and (e) control means operable to (1) operate said mixture spray means continuously during a test cycle to spray mixture in said chamber onto said assemblies; (2) operate the temperature monitoring means and resistivity monitoring means during operation of said mixture spray means; and (3) terminate the test cycle when either the resistivity of the mixture drops below a predetermined level, the temperature of the mixture is at a predetermined minimum level, or a predetermined period of time elapses from the start of the test cycle, whichever first occurs.

2. The apparatus of claim 1 including means providing an air purge of the cleaning chamber operable after the wash cycle including inert gas means for introducing an inert gas under pressure into the chamber to purge air from the chamber.

3. The apparatus of claim 2 including mixture drain means for draining mixture from the chamber, mixture fill means for adding mixture to the chamber and mixture circulating means for circulating mixture between the chamber and a mixture holding tank.

4. The apparatus of claim 1 including means for terminating the rinse cycle when the resistivity of the alcohol and water mixture exceeds a predetermined level or when a predetermined period of time elapses, whichever occurs first.

5. The apparatus of claim 1 including a means for heating and monitoring the temperature of the alcohol and water mixture in the chamber and control means operable to terminate the rinse cycle when both the temperature and the resistivity of the mixture achieve predetermined levels.

6. The apparatus of claim 5 including means for maintaining the alcohol-water mixture at a predetermined ratio.

7. The apparatus of claim 6 wherein said mixture is an isopropyl alcohol and water mixture.

8. The apparatus of claim 7 wherein said mixture is 75% isopropyl alcohol and 25% water.

9. The apparatus of claim 1 wherein the total volume of said mixture in the apparatus is less than the volume of said chamber.

10. The apparatus of claim 1 wherein said filter means includes means for cleansing the mixture of ionic contaminants within each rinse cycle and between successive rinse cycles.

11. The apparatus of claim 10 including a mixture holding tank wherein the cleansing means includes circulating means for circulating the mixture between the chamber and the mixture holding tank and said filter means includes means for filtering contaminants from the mixture positioned in the path of travel of the mixture between the chamber and tank.

12. The apparatus of claim 11 including control means operable to operate said circulating means after termination of one rinse cycle and before commencing the next successive wash cycle.

13. The apparatus of claim 1 wherein said control means includes means for adjusting the specific gravity of the mixture when the specific gravity measuring means senses a change in specific gravity of the mixture from a predetermined value.

14. The apparatus of claim 1 wherein said control means includes means for adjusting the volume of mixture in the chamber when said volume measuring means detects a volume of mixture in said chamber above or below a predetermined volume.

15. An apparatus for cleaning flux or other contaminants from printed circuit boards or other electronic assemblies comprising:

a chamber;

a door to allow access to the chamber which when closed forms a seal for the chamber;

a rack for holding printed circuit boards or other electronic assemblies stationary within the chamber, the rack being slidable out of the chamber when the door is open;

a plurality of rotatable arms located within the chamber with a plurality of spray nozzles positioned on the rotatable arms;

a means for introducing deionized water into the chamber;

a primary pump to continuously recirculate the water and other liquids in the chamber through the spray nozzles onto the printed circuit boards nested on the rack;

a drain to evacuate water and other liquids from the chamber;

a means to introduce heated water into the chamber;

a holding tank to contain a saponifying agent with a second dedicated pump to introduce the saponifying agent into the chamber for mixture with heated water thereby forming a saponifying solution;

a detection means to determine when the saponifying solution in the chamber has reached a predetermined level, the saponifying solution being recirculated by the primary pump for a predetermined time period and thereafter evacuated out of the chamber through the drain;

a means to monitor air flow between the chamber and the surrounding atmosphere to prevent the build up of a combustible gas mixture;

a holding tank to contain an alcohol and water mixture;

a sensor means in the holding tank to determine the temperature and percentage by volume of the alcohol mixture before introduction into the chamber;

a heating means to increase the temperature of the alcohol mixture to a predetermined level before its introduction into the chamber;

a third dedicated pump to introduce the alcohol mixture into the chamber;

an alcohol replenishing tank to contain absolute alcohol;

a fourth dedicated pump and corresponding feed connection to introduce the absolute alcohol from the alcohol replenishing tank into the alcohol holding tank when it is determined that the alcohol mixture in the holding tank drops below a predetermined mixture percentage by volume; and a detection means to determine when the alcohol mixture in the chamber has reached a predetermined level, said primary pump being operable after the saponifying solution is drained from the chamber and the mixture is pumped by the third pump into the chamber, to recirculate the mixture through the spray nozzles for a predetermined time period while being exposed to a conductivity testing means to determine the resistivity of the alcohol mixture thereby determining the relative cleanliness of the electronic assemblies.

* * * * *